(12) United States Patent
Lefevre

(10) Patent No.: US 12,129,539 B2
(45) Date of Patent: Oct. 29, 2024

(54) TETRAHEDRAL AMORPHOUS HYDROGENATED CARBON AND AMORPHOUS SILOXANE DIAMOND-LIKE NANOCOMPOSITE

(71) Applicant: Thin Film Service, Inc., Livermore, CA (US)

(72) Inventor: Ollivier Lefevre, Pleasanton, CA (US)

(73) Assignee: THIN FILM SERVICE, INC., Livermore, CA (US)

( * ) Notice: Subject to any disclaimer, the term of this patent is extended or adjusted under 35 U.S.C. 154(b) by 70 days.

(21) Appl. No.: 18/185,955

(22) Filed: Mar. 17, 2023

(65) Prior Publication Data

US 2023/0243029 A1  Aug. 3, 2023

Related U.S. Application Data

(63) Continuation of application No. 16/875,594, filed on May 15, 2020, now Pat. No. 11,639,543.

(60) Provisional application No. 62/851,509, filed on May 22, 2019, provisional application No. 62/851,508, filed on May 22, 2019.

(51) Int. Cl.
| | |
|---|---|
| *C23C 14/06* | (2006.01) |
| *C23C 14/10* | (2006.01) |
| *C23C 14/24* | (2006.01) |
| *C23C 14/35* | (2006.01) |
| *C23C 14/50* | (2006.01) |
| *C23C 16/50* | (2006.01) |

(52) U.S. Cl.
CPC ...... *C23C 14/0611* (2013.01); *C23C 14/0641* (2013.01); *C23C 14/10* (2013.01); *C23C 14/24* (2013.01); *C23C 14/35* (2013.01); *C23C 14/505* (2013.01); *C23C 16/50* (2013.01); *Y10T 428/30* (2015.01)

(58) Field of Classification Search
CPC . C23C 14/0611; C23C 14/0682; C23C 14/10; C23C 14/24; C23C 14/505
See application file for complete search history.

(56) References Cited

U.S. PATENT DOCUMENTS

| | | |
|---|---|---|
| 5,352,493 A | 10/1994 | Dorfman et al. |
| 5,466,431 A | 11/1995 | Dorfman et al. |

(Continued)

*Primary Examiner* — Michael P Wieczorek
(74) *Attorney, Agent, or Firm* — MASCHOFF BRENNAN

(57) ABSTRACT

A tetrahedral amorphous hydrogenated carbon and amorphous siloxane hybrid diamond-like nanocomposite composition can include: tetrahedral amorphous hydrogenated carbon (ta-C:H); and amorphous siloxane (a-Si:O), wherein the ta-C:H and a-Si:O are in an interpenetrating network. A method of forming a tetrahedral amorphous hydrogenated carbon and amorphous siloxane hybrid diamond-like nanocomposite can include: providing a source of H, C, O, and Si as a liquid precursor; providing evaporated precursor into a vacuum chamber; forming a plasma with an RF plasma generator and/or a thermal plasma generator; and depositing, on a rotating biased substrate, a collimated layer of the tetrahedral amorphous hydrogenated carbon and amorphous siloxane hybrid diamond-like nanocomposite having tetrahedral amorphous hydrogenated carbon (ta-C:H) and amorphous siloxane (a-Si:O), wherein the ta-C:H and a-Si:O are in an interpenetrating network. A RF rotating electrode is also provided.

20 Claims, 7 Drawing Sheets

(56) References Cited

U.S. PATENT DOCUMENTS

| | | | |
|---|---|---|---|
| 5,638,251 | A | 6/1997 | Goel et al. |
| 5,718,976 | A | 2/1998 | Dorfman et al. |
| 5,728,465 | A | 3/1998 | Dorfman et al. |
| 6,200,675 | B1 | 3/2001 | Neerinck |
| 6,228,471 | B1 | 5/2001 | Neerinck et al. |
| 6,472,062 | B1 | 10/2002 | Neerinck |
| 6,697,157 | B2 | 2/2004 | Wang et al. |
| 6,713,178 | B2 | 3/2004 | Veerasamy |
| 7,820,293 | B2 | 10/2010 | Dekempeneer |
| 7,947,372 | B2 * | 5/2011 | Dekempeneer ....... C23C 28/347 428/408 |
| 10,053,778 | B2 | 8/2018 | Parkhe et al. |
| 2004/0195659 | A1 * | 10/2004 | Grill ................ H01L 21/76832 257/632 |

* cited by examiner

TETRAHEDRAL AMORPHOUS HYDROGENATED CARBON AND AMORPHOUS SILOXANE DIAMOND-LIKE NANOCOMPOSITE

CROSS-REFERENCE

This patent application is a continuation of U.S. application Ser. No. 16/875,594 filed May 15, 2020, which claims priority to U.S. Provisional Application No. 62/851,508 filed May 22, 2019 and claims priority to U.S. Provisional Application No. 62/851,509 filed May 22, 2019, which applications are incorporated herein by specific reference in their entirety.

BACKGROUND

Field

The present disclosure relates to a tetrahedral amorphous hydrogenated carbon and amorphous siloxane hybrid diamond-like nanocomposite.

Description of Related Art

Coating materials have been created to solve a variety of issues and satisfy a wide range of needs. Polymers are commonly used in coating materials due to the way they can be synthesized and applied for tailored applications. When a surface is exposed to various environments and used for certain endeavors, polymers can be developed to improve the functionality of the surface in view of the application and environment.

It is generally known to coat substrates with thin films of diamond-like carbon (DLC) or diamond-like nanocomposite (DLN). These DLN films are amorphous hydrogenated carbon films (a-C:H) that display high hardness and high elasticity combined with good corrosion protection, chemical inertness, and a smooth surface. The DLN films add temperature resistance, which make these films feasible for industrial applications, such as temperature resistant, hard, wear resistant, self-lubricating, and corrosion resistant coatings. There is a high demand in the market for low friction, corrosion and wear resistant hard substrate coatings, which can retain the favorable properties of DLC or DLN, while being exposed to higher temperature environments, in particular temperatures above 500° C. Additionally, there is a need for having better non-sticking or release properties.

However, even DLN films still show several drawbacks that limit their usability in harsh high temperature industrial applications, where their maximum working temperature is limited to 600° C. and where their non-sticking and hydrophobic properties are limited. DLN films are prepared from a-C:H and a-Si:O, and therefore have a hardness limited to 25 GPA.

Another limitation is related to the current DLN deposition technologies, where larger substrates show less than perfect stoichiometry and uniformity because the existing DLN deposition technologies rely on substrate biasing whether self-induced RF bias or DC (pulsed or direct) bias to ionize the gasses presented at the substrate's biased sheath. This limits the range of bias and pressure that can be applied in this process. In certain semiconductor processes, where deposition masks are used, a bias needs to be applied to substrate/mask setup so a patterned deposition is achieved (i.e., bump or dot coatings on semiconductor pedestals). The geometry and thickness of the mask along with applied bias and sheath thickness makes coating uniformity challenging. Similarly, these technologies limit the level of ionization and dissociation of the introduced precursors.

A practical problem with current DLN processes is their reliance on the availability of liquid siloxane precursors, where some processes demand a high Si and O content and where others demand for the opposite formulas. This warrants the fabrication of customized precursors, which can be expensive.

Thus, there is a need for a improved materials that can be used in low friction applications and at high temperatures or other harsh conditions.

SUMMARY

In some embodiments, a tetrahedral amorphous hydrogenated carbon and amorphous siloxane hybrid diamond-like nanocomposite composition can include: tetrahedral amorphous hydrogenated carbon (ta-C:H); and amorphous siloxane (a-Si:O), wherein the ta-C:H and a-Si:O are in an interpenetrating network.

In some embodiments, a method of forming a tetrahedral amorphous hydrogenated carbon and amorphous siloxane hybrid diamond-like nanocomposite can include: providing a source of H, C, O, and Si as a liquid precursor; providing evaporated precursor into a vacuum chamber; forming a plasma with an RF plasma generator and/or a thermal plasma generator; and depositing, on a rotating biased substrate, a collimated layer of the tetrahedral amorphous hydrogenated carbon and amorphous siloxane hybrid diamond-like nanocomposite having tetrahedral amorphous hydrogenated carbon (ta-C:H) and amorphous siloxane (a-Si:O), wherein the ta-C:H and a-Si:O are in an interpenetrating network.

In some embodiments, a RF rotating electrode can include: a non-rotating body having a rounded lip forming a recess; slip anchors mounted to the body in the recess, the slip anchors being a conductive material; a rotating contact in electrical connection with the slip anchors, wherein the rotating contact includes a rounded edge so as to form a gap with the rounded lip of the non-rotating body; a striker pin electrically coupled to the slip anchors; an electrical insulator surrounding the striker pin; a mating striker pin seated in a spring; a conducting body connecting the striker pin and the mating striker pin; and an electrode electrically coupled with the spring.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and following information as well as other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

Figure 1:
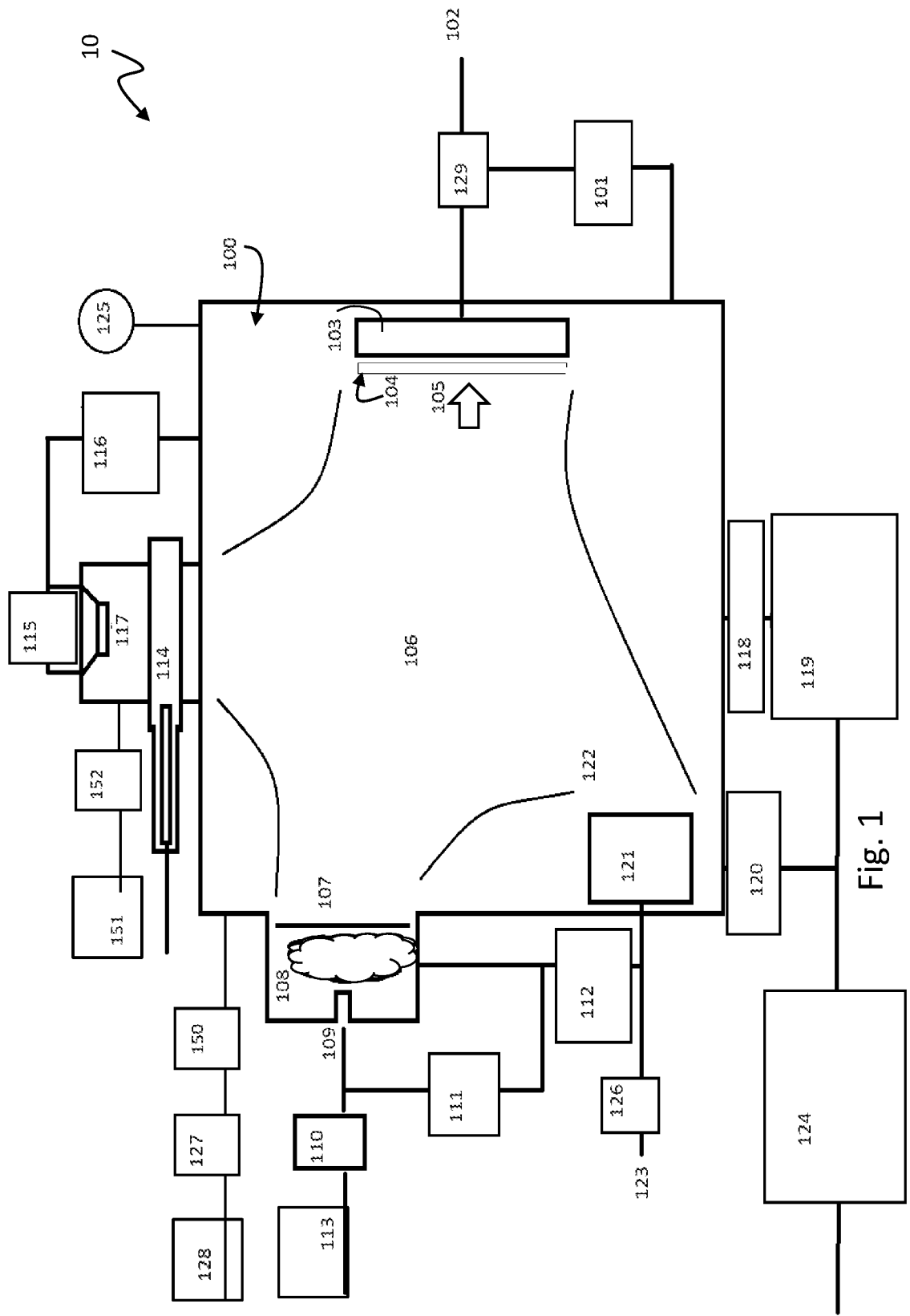
FIG. 1 illustrates an embodiment of a vacuum chamber that can be used to prepare a tetrahedral amorphous hydrogenated carbon and amorphous siloxane hybrid diamond-like nanocomposite.

The elements and components in the figures can be arranged in accordance with at least one of the embodiments described herein, and which arrangement may be modified in accordance with the disclosure provided herein by one of ordinary skill in the art.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

Generally, the present technology relates to a hydrophobic self-lubricating hard coating material as well as the methods of making and using the same. Additionally, the present technology relates to articles that have at least one surface that is coated with the hydrophobic self-lubricating hard coating material as well as the methods of coating surfaces and using the coated surfaces. The coating material that is described herein can be provided in embodiments that have improved functionality and application protocols.

In some embodiments, a composition can include an improved diamond-like nanocomposite (IDLN) comprising networks of materials based on tetrahedral amorphous ta-C:H and amorphous a-Si:O, or modified therefrom. The composition can include films and coatings of the IDLN, and methods of their manufacture. In some aspects, IDLN coated substrate surfaces, whether rigid or flexible, are provided with a thin coating of IDLN material to obtain properties rendering the surface to be highly temperature resistant, etch and wear resistant, superhydrophobic, self-lubricating and extra hard. Some embodiments also relate to a new vacuum process for coating the substrates with the IDLN faster, more uniformly, and with better stoichiometry compared to prior DLNs.

In some embodiments, the invention relates to a substrate covered at least in part with the IDLN, wherein the IDLN is configured to be a hydrophobic self-lubricating multilayered hard coat with a temperature resistance in vacuum and air of up to about 1450° C. The IDLN can be a highly tetrahedral amorphous diamond like nanocomposite coating that includes an amorphous siloxane hybrid caged tetrahedral amorphous hydrocarbon diamond-like nanocomposite composition. The IDLN can include a tetrahedral amorphous hydrogenated carbon ta-C:H (Me) and amorphous siloxane a-Si:O (Me). The IDLN can be preferably but not exclusively, doped with any or a combination of transition metals of 1b-7b, 8b groups (e.g., IB, IIB, IIIB, IVB, VB, VIB, VIIB, and VIIIB) of the periodic table, having excellent etch, wear and temperature resistance, adhesion, and friction properties combined with improved high elasticity and flexibility. As described herein, the IDLN may be used and referred to as the coating material or generally as the composition.

In some embodiments, the coating material can be configured to have high temperature stability and can maintain structure and composition with reduced degradation when subjected to higher temperatures. The coating material can be configured to resist degradation by having a high resisting temperature, such as for example a resisting temperature of up to or about 1450° C., up to about 1300° C., of up to about 1250° C., of up to about 1200° C., of up to about 1150° C., of up to about 1100° C., or up to about 1050° C., or at least about 1000° C. or a range between any of these recited resisting temperature values. As such, the coating material has a high resisting temperature below which the material inhibits degradation or loss of performance, and above which there is little resistance to degradation or loss of performance. In some aspects, the resisting temperature can be measured in a vacuum and air of up to 1200° C. or higher.

In some embodiments, with the present inventive deposition by electron assisted remote plasma deposition technology for the fabrication of the IDLN (e.g., tetrahedral amorphous hydrogenated carbon and amorphous siloxane hybrid diamond-like nanocomposite), the composition can include amounts of C, H, Si and O that can be tailored individually to the required needs and a variety of siloxanes and hydrocarbon gasses can be utilized. In some instances, the amorphous siloxane may cage the tetrahedral amorphous hydrogenated carbon. In some instances, the tetrahedral amorphous hydrogenated carbon can cage the amorphous siloxane. In some aspects, all additional trim precursors, preferred to but not limited to $O_2$, $H_2$, $N_2$ and $CF_4$, can be individually dosed, ionized and/or dissociated. The fabrication setup allows control of the Sp2/Sp3 ratio of the grown film to a certain extent.

In some embodiments, the coating material can be applied in an improved technique that facilitates the improved chemical durability and performance. The application protocol can be adapted for the coating material being a IDLN that is applied as a coating to a substrate in a vacuum chamber environment. The coating can include polydimethylsiloxane hybrid caged hydrocarbon diamond-like nanocomposite composition. The polydimethylsiloxane can be configured with the hydrogenated carbon to create the hybrid material for improving the performance. This improvement in the material characteristics can provide resistance to etching, wearing, and/or temperature degradation. The coating can provide improved adherence or adhesion to the substrate that is it coating on, and thereby provides resistance to breaking the adhesion, flaking or otherwise degrading. The coating also provides reduced friction properties to that it is slick or slippery, which improves its durability. The coating also has improved high elasticity and flexibility. Thus, the coating can be applied to surfaces that may be subjected to high temperatures and provides reduced friction with increased elasticity and flexibility.

The coating can increase the temperature resistance by at least two times when compared to state of the art available high temperature diamond based hard coat. Additionally, the superhydrophobic nature of this coating provides very small contact and sliding angles, such as sliding angles shown to be less than about 10 degrees. Moreover, the siloxane metal doped hydrocarbon coating has configurable electrical properties, where it can be created to be entirely conductive or to be dielectric, and all variations of conductivity between conductive to dielectric.

In some embodiments, the IDLN can include tetrahedral amorphous hydrogenated carbon and amorphous siloxane hybrid diamond-like nanocomposite materials that are related to similar DLN films, but are improved to have the advantage over prior DLNs as they improve on sliding properties, elasticity, wear resistance and max service temperature, while preserving other properties like adhesion, hardness and corrosion resistance. Tetrahedral amorphous hydrogenated carbon and amorphous siloxane hybrid diamond-like nanocomposite films of the IDLN have a better sp3/sp2 ratio because of a higher sp3 content and lower stress.

Deposited prior DLC films exhibit much higher internal stresses (e.g., above 1 GPa) than an IDLN of tetrahedral amorphous hydrogenated carbon and amorphous siloxane hybrid diamond-like nanocomposite (e.g., 50-200 MPa), thus the prior DLC films impeded good adhesion to the substrate when mechanically stressed. Now, the IDLN can be applied to the substrate with good adhesion. In some aspects, the prior DLC films on substrates may require the use of intermediate adhesion promoting layers. However, with the IDLN, intermediate adhesion promoting layers are not needed for a tetrahedral amorphous hydrogenated carbon and amorphous siloxane hybrid diamond-like nanocomposite film. Another disadvantage of DLC impeding widespread commercialization is the fact that these DLC films lack the planarizing effect that can now be achieved with the tetrahedral amorphous hydrogenated carbon and amorphous siloxane hybrid diamond-like nanocomposite film of the IDLN.

In some embodiments, the present invention results in an IDLN film without pinholes, where the substrate underneath the IDLN coating is completely protected from the environment it functions in or is used in. Prior DLC films often suffer from effects caused by the media it is trying to seek protection from. Due to the tetrahedral amorphous hydrogenated carbon and amorphous siloxane hybrid diamond-like nanocomposite multilayer and/or gradient structure with its planarizing effect, the IDLN process of seed formation and consequent nodule formation is eliminated and a pinhole-free film (e.g., devoid of pinholes) with excellent barrier properties is created. Also unlike a prior DLC, the tetrahedral amorphous hydrogenated carbon and amorphous siloxane hybrid diamond-like nanocomposite IDLN film retains its coefficient of friction (COF) of <0.1, but typically <0.01 in air with high relative humidity and in vacuum after exposure of 1000° C. in oxygen and has shown to withstand 1450° C. in vacuum. Prior DLC films are limited to 450° C. and the prior DLN fails at 550° C. to 650° C. Thus, the improved IDLN materials of the present invention retains a COF of 0.05 after a 20 min temperature exposure of 1350° C.

Additionally, another big improvement over prior DLN coatings is that the formation of the IDLN includes a mixture or cocktail of precursors that retails around 95% cheaper when compared to alternative siloxane precursors used with prior DLNs. This added benefit of the IDLN opens up the market to become competitive with TIN coatings in the 200 mm market. Previously, DLN has failed to break into this market because of the expensive media used. Now, the present invention can provide the IDLN as a one size fits all embodiment and can support all SEMI processes from 200 mm to 300 mm and up to 450 mm.

In some embodiments, the deposition processes disclosed herein to form the IDLN, tetrahedral amorphous hydrogenated carbon and amorphous siloxane hybrid diamond-like nanocomposite are produced that include a hybrid caged tetrahedral amorphous (e.g., ta-C:H) diamond-like network and an amorphous (e.g., a-Si:O) glass-like network optionally with metal and/or fluoride doping. The IDLN can be used in a coating for the use on substrates, such as glass, ceramics, ceramic oxides and nitrides, and on flexible low temperature substrates like PET, metals or semiconductor materials found in the IV and III-V groups of the periodic table like, but not limited to Si-wafers. The networks of the IDLN interpenetrate into each other and some Si—C-bonds may be present. The components of the IDLN can be present in generally broad parameter ranges for the deposition processes. The physical characteristics of the resulting coating layers are thus also ranging between large boundaries. The deposition process also allows for creation of hard films that are either highly capacitive with a resistivity exceeding $10^{11}$ ohm/meter or conductive with resistivity below $10^{-3}$ ohm/meter.

In some embodiments, the improved diamond-like nanocomposite (IDLN) composition is an improvement over prior DLC or DLN or other similar. The IDLN can be configured by modulating proportions of components to achieve a particular coefficient of friction (COF) against steel that is smaller than but not limited to about 0.01 in air with a relative humidity (RH) up to 80%, or respectively in water. The IDLN can retain hardness after exposure to conditions that can reach but not limited of up to about 40 Gpa. The IDLN can achieve contact angles up to 155 degrees, or from about 130 to about 155 or from about 105 to about 130, or from about 80 to about 105. Additionally, the IDLN can have sliding angles below 1 degree, or from about 0.2 to about 1 or about 1 to about 5, or from about 15 to about 5. A friction test for determining this coefficient is described below.

In some embodiments, the IDLN composition comprises networks of tetrahedral amorphous ta-C:H and amorphous a-Si:O. The H-concentration is preferably but not limited to between about 5 at % (atomic percent) and about 45 at % of the total concentration, or from about 8 at % to about 40 at %, or from about 10 at % to about 35 at %. In some aspects, composition can have H-concentrations to be below 8 at % when in a polycrystalline structure. The H-concentration may also increase up to 45% in the more polymeric amorphous a-C:H films. This hydrogen may be bonded with the Sp2 or Sp3 configuration or might appear in molecule form as its buried or trapped in the oncoming species. In a pure DLC form, the Sp3 content of up to about 75% can be achieved, or up to about 70%, or up to about 65%, or up to about 60%. Surface energies from about 15 mN/m to about 30 mN/m (or from about 20 mN/m to about 25 mN/m) are achieved when the final layer or cap layer are being bombarded or post processed with a mix of $CF_4$ and Ar where the $CF_4$ concentration ranges from 40 wt % (weight percent) to 125 wt % of the Argon concentration, or from 50 wt % to about 110 wt %, or from 75 wt % to about 100 wt %.

In some embodiments, the composition can be tailored to suit the film requirements, where the concentration of a component may be included within certain ranges, such as described as follows: Carbon concentration can range from about 50 at % to about 92 at %, or about 60 at % to about 85 at %, or about 70 at % to about 80 at %, or about 75 at %; Silicon ranges from 10 at % to 25 at %, or about 15 at % to about 20 at %, or about 17 at % to about 18 at %; and Oxygen ranges between 7 at % and 15 at %, or about 9 at % to about 13 at %, or about 10 at % to about 12 at %. In some embodiments, the fluoride content is present (e.g., 0.0001%) but kept below about 4 at % when used in the final layer, or less than about 3%. The metal (e.g., transition metals), such as alloys, preferably but not limited to titanium and tungsten, can be used to dope the film from about 0 at % and about 12 at %, or less than about 8 at %, or less than about 5 at %.

The IDLN can be formed into a composite that has a nanohardness of at least about 6 GPa, such as from about 6 to about 40 GPa, or about 10 GPa to about 30 GPa, or about 20 GPa to about 25 GPa. The composition comprises a low coefficient of friction of less than about 0.2, such as from about 0.01 to about 0.05, or 0.01 to about 1, or about 0.1 to about 0.5.

The IDLN composition can include (e.g., be doped with) at least one transition metal of the d-block elements. The controlled incorporation of metals in tetrahedral siloxane hybrid caged hydrocarbon diamond-like nanocomposite structure leads to tailorable optical, electrical, toughness, boundary and tribological properties. The IDLN can also be configured into a composite layer with a resistivity of from about $10^{-3}$ Ohm·cm to about $10^{11}$ Ohm·cm, such as by varying the metal doping concentration.

Figure 6:
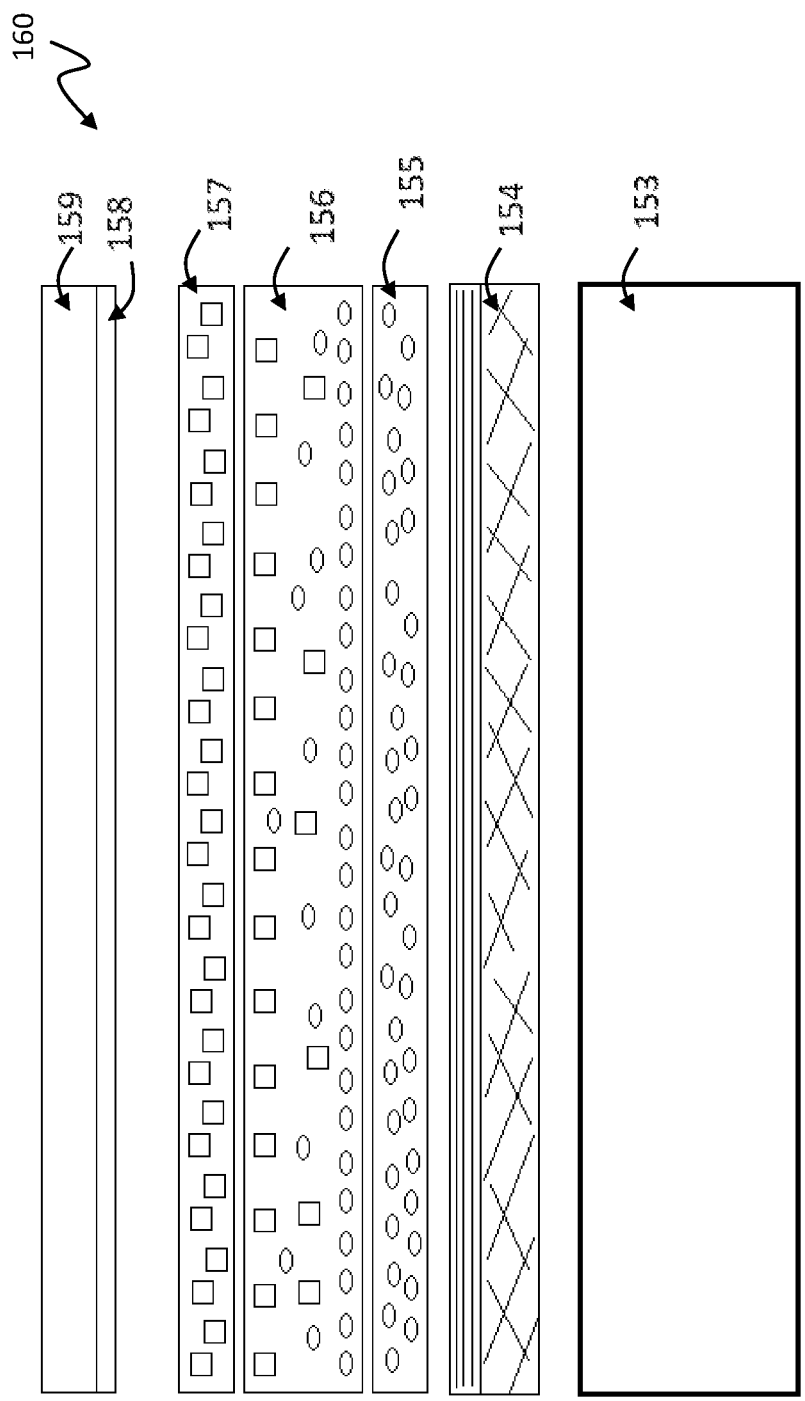
FIG. 6 illustrates an exploded view of a film stack that includes layers of the tetrahedral amorphous hydrogenated carbon and amorphous siloxane hybrid diamond-like nanocomposite, as formed the illustrated layers are in contact with each other in the shown sequence.

The IDLN coating can be applied to various substrates, which are preferably cleaned. The IDLN can be formed as layers, which form a layered structure or stack of films. As shown in FIG. 6, the IDLN 160 can include: a substrate 153; a titanium nitride layer 154; a first diamond-like nanocomposite (DLN) layer 155; a transition layer 156; a second DLN layer 157; and a final layer 158. Optionally, a super hydrophobicity layer 159 can be applied over the final layer 158. All layers 154, 155, 156, 157, 158 described in this IDLN stack can be doped with alloys to achieve the required electrical and thermal conductivity.

The titanium nitride layer 154 may be a sublayer that can have a thickness from about 0.05 μm to about 2 μm, or about 0.1 μm to about 1 μm, or about 0.25 μm to about 0.75 μm. Alternatively, the IDLN can omit the titanium nitride layer 154, so as to have an absence of a sublayer that is directly deposited onto the substrate.

The first DLN layer 155 can include interpenetrating networks of tetrahedral amorphous hydrocarbons (ta-c:H) and amorphous siloxane (a-Si:O) having a thickness from about 0.1 μm to about 4 μm, or about 0.5 μm to about 3 μm, or about 0.75 μm to about 2 μm, or about 1 μm to about 1.5 μm. The second DLN layer 157 can have a thickness from about 0.1 μm to 4 μm, or about 0.5 μm to about 3 μm, or about 0.75 μm to about 2 μm, or about 1 μm to about 1.5 μm. The first DLN layer 155 can have a different composition from the second DLN layer 155. Alternatively, the first DLN layer 155 can have the same composition from the second DLN layer 155.

The transition layer 156 can be positioned between the first DLN layer 155 and second DLN layer 157, and can include a mixture of the first DLN layer 155 and DLN 157. The transition layer 156 can include a thickness from about 0.3 μm to about 6 μm, or about 0.75 μm to about 5 μm, or about 1 μm to about 4 μm, or about 2 μm to about 3 μm. In some aspects, the transition is thicker than the first DLN layer 155 or thicker than the second DLN layer 157. The composition mixture of the transition layer 156 changes gradually in a gradient or in multiple steps (e.g., step changes) between said first DLN layer 155 and second DLN layer 157. At the first DLN layer side, the transition layer 156 has a composition of or similar to the first DLN layer 155. At the second DLN layer side, the transition layer 156 has a composition of or similar to the second DLN layer 157.

The final layer 158, which can be considered to be a cap layer, can include either of a diamond like carbon layer (DLC), preferable but not limited to: a high (>0.8 Sp3 fraction) tetrahedral amorphous hydrogenated carbon layer, a low (<0.4 Sp3 fraction) amorphous carbon layer; or tetrahedral amorphous hydrogenated carbon and amorphous siloxane hybrid diamond-like nanocomposite with interpenetrating networks of tetrahedral amorphous hydrocarbon ta-c:H and amorphous siloxane a-Si:O. The final layer 158 can be of various thicknesses, such as from about 0.05 μm to about 2 μm, or from about 0.1 μm to about 1 μm, or from about 0.2 μm to about 0.5 μm.

The optional super hydrophobicity layer 159 is achieved by a post process ion bombardment of an CFA/argon mixture. The super hydrophobicity layer 159 can be of various thicknesses, such as from about 0.002 μm to about 0.5 μm, 0.02 μm to about 0.1 μm. 0.02 μm to about 0.08 μm.

In some embodiments, a tetrahedral amorphous hydrogenated carbon and amorphous siloxane hybrid diamond-like nanocomposite composition can include: tetrahedral amorphous hydrogenated carbon (ta-C:H); and amorphous siloxane (a-Si:O), wherein the ta-C:H and a-Si:O are in an interpenetrating network. In some aspects, the ta-C:H can be present from about 0% to about 100% and the a-Si:O can be present from about 0% to about 100%. In some aspects, the composition includes: hydrogen from about 0.5 at % to about 45 at %; carbon from about 50 at % to about 92 at %; silicon from about 10 at % to about 25 at %; and/or oxygen from about 7 at % to about 15 at %. In some aspects, the hydrogenated carbon is a hydrocarbon. In some aspects, the siloxane is polydimethylsiloxane.

In some embodiments, the composition is doped with at least one transitional metal, wherein the transition metal is at least one of: a IB group transition metal selected from the group of Cu, Ag, Au, or Rg; a IIB group transition metal selected from the group of Zn, Cd, Hg, or Cn; a IIIB group transition metal selected from Sc and Y; a IVB group transition metal selected from Ti, Zr, Hf, and Rf; a VB group transition metal selected from V, Nb, Ta, and Db; a VIB group transition metal selected from Cr, Mo, W, and Sg; a VIIB group transition metal selected from Mn, Tc, Re, and Bh; or a VIIIB group transition metal selected from Fe, Ru, Os, and Hs. In some aspects, the transition metal is included in a doping amount to achieve a resistivity about $10^{-3}$ Ohm·cm to about $10^{11}$ Ohm·cm.

In some embodiments, the composition can include a top layer of fluorocarbon on the interpenetrating network of ta-C:H and a-Si:O. In some aspects, the fluorocarbon is present from about 50 wt % to about 110 wt % of Argon in the top layer.

In some embodiments, the composition includes at least one of: Sp3 content up to about 75%; surface energy of about 15 mN/m to about 30 mN/m; nanohardness of about 6 Gpa to about 40 Gpa; and/or coefficient of friction of about 0.01 to about 0.1.

In some embodiments, a film stack including the tetrahedral amorphous hydrogenated carbon and amorphous siloxane hybrid diamond-like nanocomposite composition can include the following sequence: a first layer of the tetrahedral amorphous hydrogenated carbon and amorphous siloxane hybrid diamond-like nanocomposite; a transition layer; and a second layer of the tetrahedral amorphous hydrogenated carbon and amorphous siloxane hybrid diamond-like nanocomposite, wherein the first layer is different from the third layer. In some embodiments, the film stack can include a final layer over the second layer, wherein the final layer includes: a high $Sp^3$ tetrahedral amorphous hydrogenated carbon layer; a low $Sp^3$ amorphous carbon layer; or a third layer of the tetrahedral amorphous hydrogenated carbon and amorphous siloxane hybrid diamond-like nanocomposite, wherein the third layer is different from at least one of the first layer or second layer. In some aspects, the film stack can include a titanium nitride layer under the first layer. In some aspects, the film stack can include a top layer of fluorocarbon above the second layer.

In some embodiments, the film stack can include at least one of the following: the titanium nitride layer is from about 0.02 microns to about 2 microns, when present; the first layer is from about 0.1 microns to about 4 microns; the transition layer is from about 0.3 microns to about 6 microns; the second layer is from about 0.1 microns to about 4 microns; and the final layer is from about 0.2 microns to about 2 microns, when present.

In some embodiments, a coated substrate can include: a substrate; and the film stack of one of the embodiments coating at least a portion of a surface of the substrate.

In some embodiments, the IDLN is formed by an improved process and method of depositing such coatings. Compared to DLN, this new diamond like thin film coating (e.g., IDLN) increases the temperature resistance by to about 1450° C., and improves the superhydrophobic nature of this coating, where high contact angles and low sliding angles have been shown. The coating is tailorable and its electrical and thermal properties can be altered. This allows for a variety of substrates to be coated, such as semiconductor chucks based on Johnsen-Rahbek or Coulomb to be coated with a particle-reducing protective layer of the IDLN. The deposition rate, which is around 1.5× to 2× when compared to existing DLN deposition system, is a direct result from the higher dissociation and ionization levels intrinsic with the new technology. Dissociation levels of 100% with ionization level of over 20% are feasible. The added-on bonus of the latter mentioned ionization and dissociation levels is that the uniformity on the substrate has been vastly improved. The large pressure ranges this process can operate in along with the high level of pre-ionization and dissociation promotes collimated deposition along the entire substrate of the hydrocarbons, siloxanes, and metals and other materials. The improved technique is performed to apply siloxanes and metal doped hydrocarbon-based coatings in a vacuum chamber environment. Compared to the technology applied in U.S. Pat. No. 6,228,471, the present invention allows the protocol to alter the composition of the siloxanes used, which substantially increases the ionization rate and dissociation levels and improves reliability and stability of the process by offering electron emitters compatible with the use of hydrocarbons. Compared to processes where the substrate bias is responsible for the plasma generation, the present invention has significant lower plasma damage. The coating can be tailored to have excellent superhydrophobic properties and controlled wettability and non-sticking properties. Also, the reliability of the electron emitters, which are now compatible with the use of hydrocarbons, has been vastly improved over the typical tungsten filament.

As shown in FIG. 6, a substrate 153 can be previously cleaned with the remote plasma source or by ION bombardment created by the substrate bias before the IDLN is formed thereon. The cleaning can be by gasses preferably but not limited to Argon and Krypton. The preclean removes oxides and other contaminants present on the substrate.

FIG. 1 shows an embodiment of a system 10 for preparing the IDLN, which will be described in the method for preparing the IDLN. The method includes a process with parameters for coating a substrate with the IDLN composition having the properties described above. The process is carried out in an improved vacuum chamber 100. The method can be initiated in step (a) by introducing into the vacuum chamber 100 a liquid organic precursor 128 with a controlled flow by a flow controller 127 (e.g., pump) and formed into an evaporated state with an evaporator 150. The precursor composition can contain the elements C. H, Si and O to be deposited in the suitable proportions, along with the hydrocarbon and fluoride.

FIG. 1 illustrates a vacuum chamber 100 that is being pumped down by a series of vacuum pumps 124 and 119, which control the pressure through pressure sensors 125 and throttle valves 118 and 120. Additional valves 114 protect the emitter 117. Precursors 128 and gasses 113, 151 and 123 can be introduced through port in the RF plasma generator 100, mass flow controllers 127, 152 or sputter target 126. The substrate 103 can rotate and can be provided by a bias RF rotating electrode 129 via pulsed DC or mid frequency by the power source 101. That bias can clean the substrate 103 or can create energy for the ion implantation process, but does not create ions.

In some aspects, it can be preferably that the plasma energy is controlled through a network of power supplies for the electron emitter 115, RF plasma creator 111, plasma bias supply 116 and the substrate power source 101. The target is controlled by a sputter power supply 112 which can be hipims (high power impulse magnetron sputter), DC or pulsed DC. The combination creates a very dense plasma 106 which allows for collimated deposition of material 105 through a mask 104 onto the substrate 103. Substrate cooling can be provided through port 102.

FIG. 1 also shows a computing device 600 that can be operably coupled with each of the components of the system 10. The computing device 600 can function as a controller for the vacuum chamber 100 and components. As such, the computing device 600 can receive operational data from the components, and provide instructional data to the components to initiate, modulate, or terminate operation. The computing device 600 can also receive sensor data that can be processed in order to provide instructional data. The computing device can be configured to operate the system 10 in order to perform the methods described herein. A such, a memory device (e.g., system memory 606) can include computer-executable instructions for performing the method of operating the vacuum chamber 100 in order to manufacture the IDLN material as described herein.

In step (b), a thermal plasma dissociation can be achieved with a refractory element 117 and/or a RF plasma generator 109 for dissociation 108 of the introduced precursor 128 in the chamber 100 to suitable proportions.

In step (c), the system 10 can be operated for forming a dense quasi-neutral plasma 106 in the chamber 100 between 0.02 amps and 60 amps from introduced gasses 113 and 151 and precursors 128 by but not limited to an electron assisted DC-discharge 115 using the refractory ceramic emitter 117, which can be preferably hexaboride but could also be lanthanum hexaboride or a carbon filament. Cerium hexaboride would be preferred because of its resistance to carbon and for that same reason a carbon filament could also be used. Cerium and lanthanum boride electrodes are shielded behind a vacuum valve 114 during vent cycles to prevent cracking. These are superior over the tungsten filaments used in other processes as these filaments become brittle during the hydrocarbon deposition process and therefor arc or break. Additionally, refractory ceramic emitters 117 show a tenfold increase in ionization levels when compared to conventional hot filament setups which allows for lower pressure deposition. The flow of the gasses 151 and 113 can be controlled by flow controllers 110 and 152 whilst the flow of the precursors 128 is controlled by liquid flow controller 127.

In step (d), the RF plasma generator 109 can cause dissociation 108 and the optional forced extraction 107 of the introduced precursor gasses 113, typically but not limited to Argon, Nitrogen, Oxygen and Krypton. Evaporation of liquids 128, typically but not limited to siloxanes with controlled flow 127 and evaporated to a gaseous state by the evaporator 150 are mixed with solids 121 while they reside in a dense plasma 106 of minimum 1012 cm-3 and up to 1019 cm-3 on their trajectory to the substrate in a changing electrical field. Another variation is to introduce process gasses, typically but not limited to hydrocarbons, Nitrogen and noble gases into chamber 100 through mass flow controllers 126 and 152 to help with sustaining the plasma.

In step (c), the collimated deposition of material 105 through mask 104 (e.g., 134 FIG. 4) of the composition on the rotating substrate 103 is achieved, such as by a bipolar asymmetrical pulsed DC-bias or mid frequency (MF) self-bias voltage 101 of 30 V to 1100 V with a reverse is applied specifically designed and built for this process in order to attract ions formed in the plasma 106. The power is distributed to the substrate 103 via a specially designed and in-house built high frequency rotational electrode 129 (e.g., RF rotating electrode), which is illustrated in FIG. 5. The reverse positive portion of the bias is preferable but not limited to a range of 300 V to 1500 V with a duration of 5% to 30% of the negative pulse duration. A delay between the negative pulse and the positive pulse of 0.05 to 1 microsecond is preferred but not required.

Figure 2A:
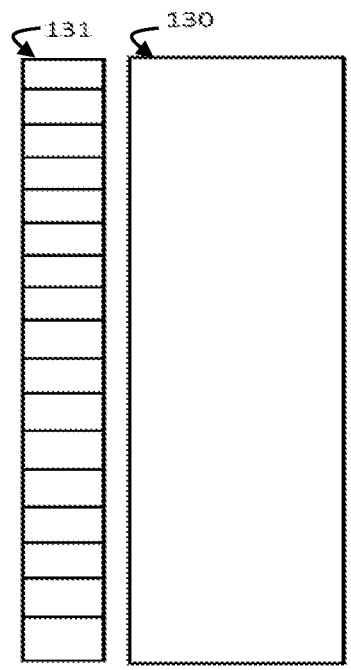
FIGS. 2A-2B illustrate embodiments of masks associated with a substrate of the vacuum chamber.
Figure 2B:
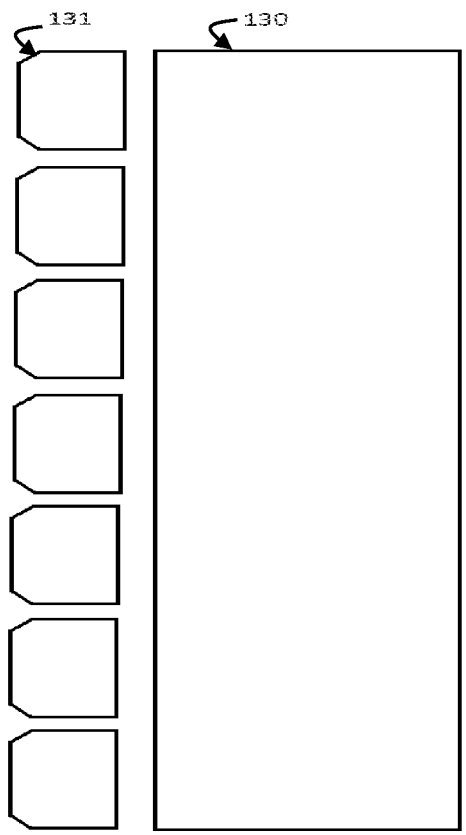

FIG. 2A-2B show that a substrate 130 can be covered by a deposition mask 131, which can assume a variety of shapes and materials. The purpose of the mask is to create patterns on a variety of substrates.

Figure 3:
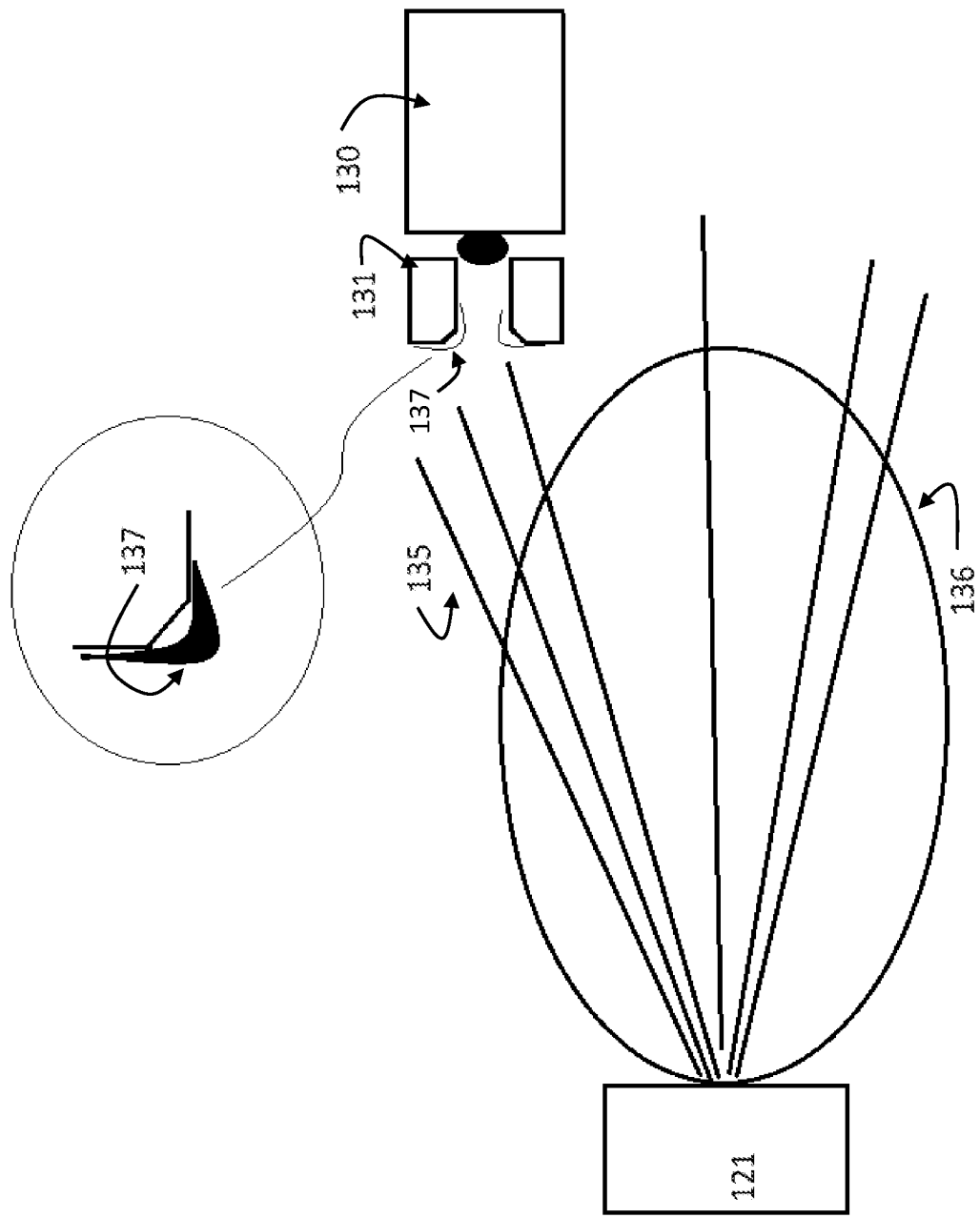
FIG. 3 illustrates a prior art deposition process.

FIG. 3 is a schematic representation of a demonstration of existing technologies (e.g., Prior Art) where a point source 121 or a sputter target with sinusoidal distribution 136 of slightly ionized materials create deposition patterns through a mask 131 and where shadowing 137 related to non-collimated flux 135 causes non-uniformity and stoichiometry issues in the arriving flux. This may form poor materials.

Figure 4:
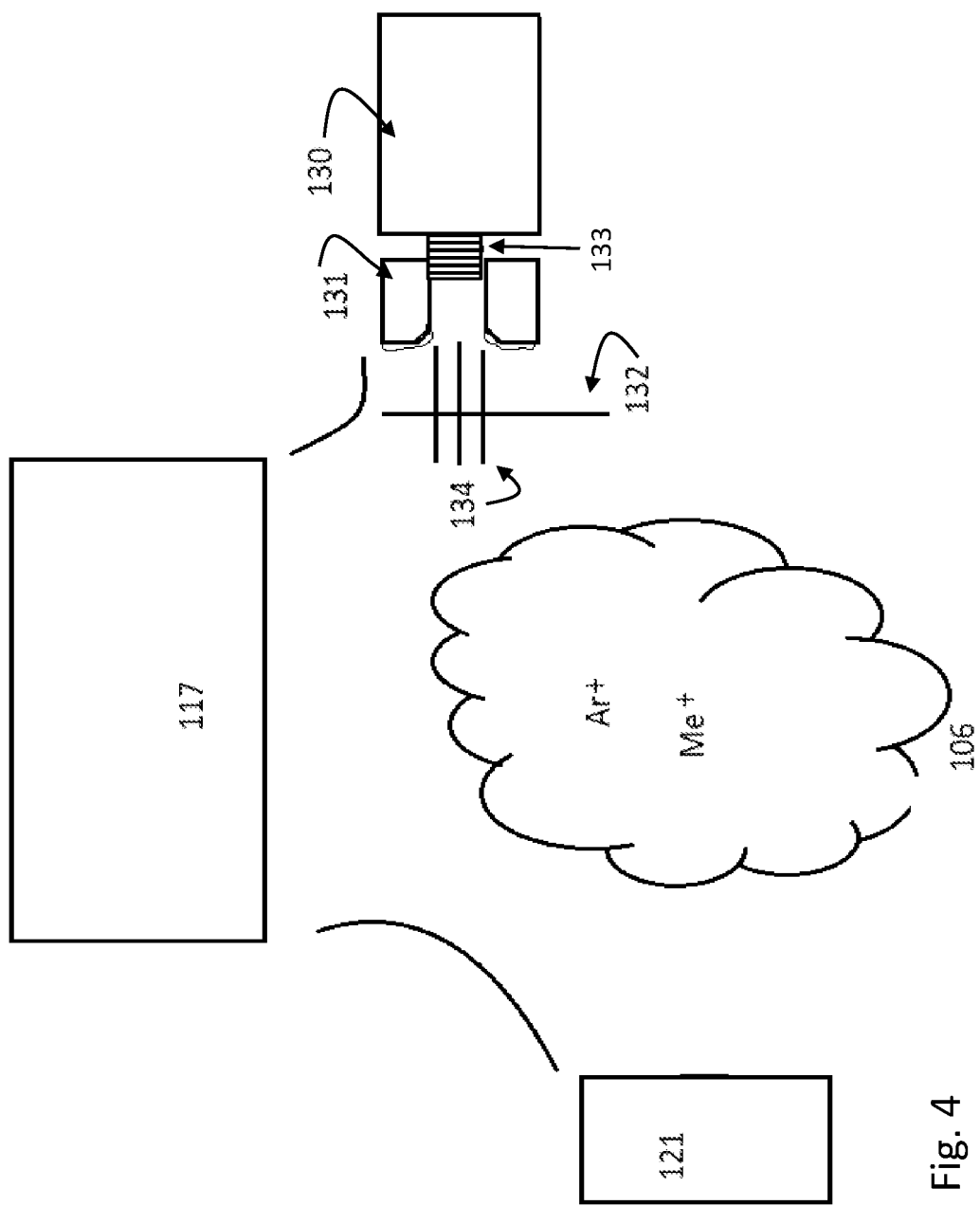
FIG. 4 illustrates an embodiment of collimated deposition of a tetrahedral amorphous hydrogenated carbon and amorphous siloxane hybrid diamond-like nanocomposite.
Figure 5:
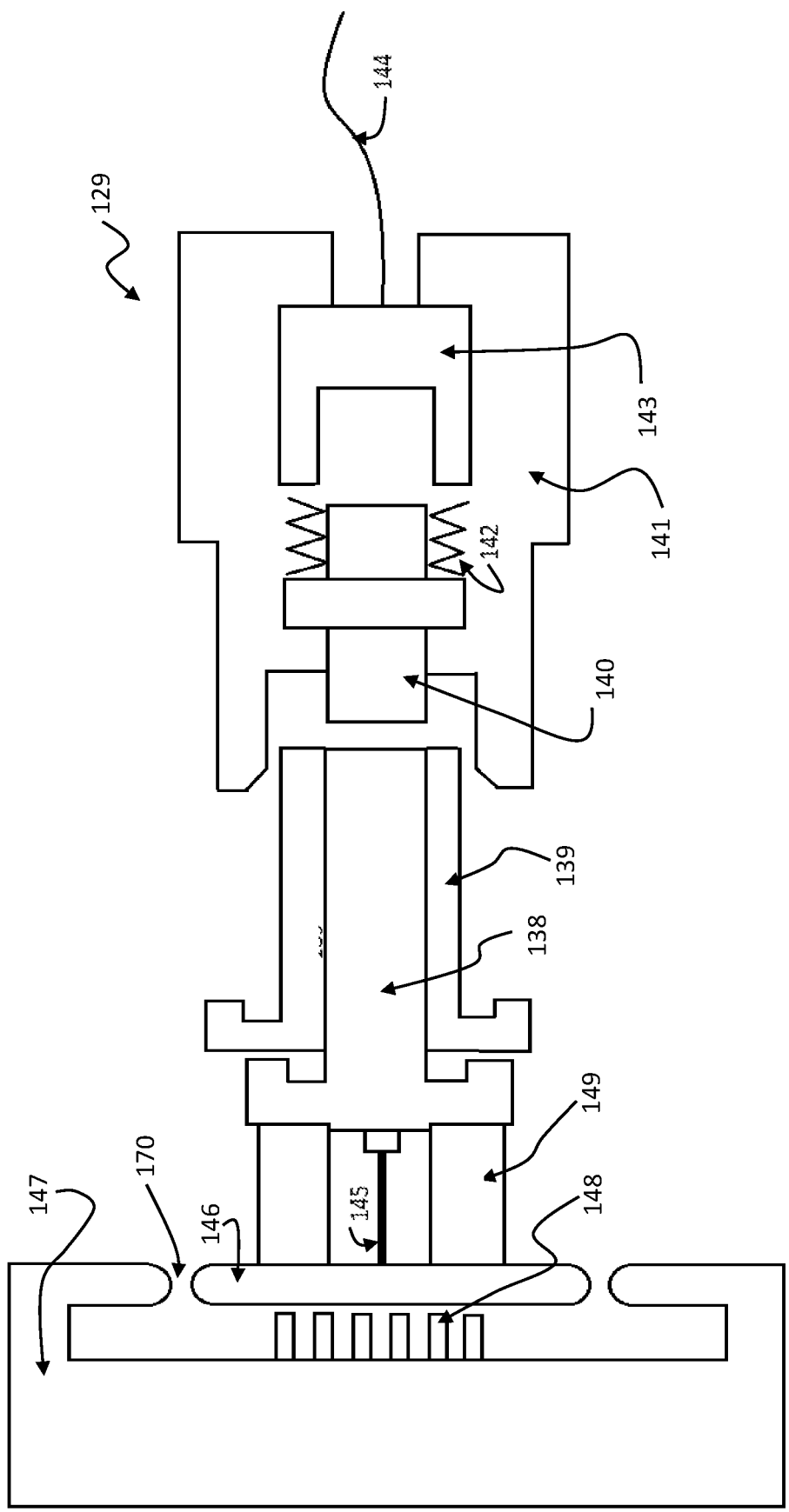
FIG. 5 illustrates an embodiment of a RF rotating electrode.

FIG. 4 is a schematic representation of a demonstration of the improved technology of the present invention where a high density electron emitter 117 further ionizes the metal flux from the sputter magnetron 121 and combines the species with the hydrocarbon and siloxane precursors already ionized in the RF ions source (RF plasma generator 109) from FIG. 1. The result is a highly ionized plasma 106 and a collimated deposition 134 through a mask 131. The pressure in this new invention are significantly low enough that the bias sheath or cathode sheath extends past the mask 131 which aids the directionality of collimated deposition 134 to the substrate 130 and sheath collisions are avoided. This forms the IDLN material 133.

FIG. 5 shows a detailed schematic of a RF rotating electrode 129 that is configured to withstand voltages of up to 2500 V and currents of up 15 amps at frequencies of up to 13.56 MHZ. A spring-loaded RF feedthrough was designed to avoid connector breakage which is typically a problem with rotating large assemblies that expand and contract, bow and oscillate. In some aspects, both electrode contacts stay conform and centered with assured contact. RF power is applied to the non-rotating part of the electrode 147 and slip anchors 148 transfer that energy to the rotating contact 146. Both bodies (e.g., electrode 147 and rotating contact 146) are made of silver plated copper, but original versions were built in copper only. Both bodies (e.g., electrode 147 and rotating contact 146) are rounded at the gap 170 between them to prevent arcing. A coax cable connects the anchor to the striker pin 145 and is covered by an electrical insulator 149. The striker pin 145 is seated inside an insulator 149 with excellent mechanical and vacuum properties. These parts are mounted permanently on the chamber. The parts described here below are mounted on the substrate 103. A mating striker pin 140 is seated on a specially designed spring 142 rated to transfer high RF power and assured that the striker pin 145 in the tool 138 (e.g., conducting body) in the insulator 139 stays conformed with mating striker pin 140 on the substrate. The RF power or DC power is transferred by the spring 142 to the electrode 143 connected to the substrate via a wire 144. The assembly is seated in an insulator 141 which a is also the vacuum seal.

As shown, the electrode 143 can include a recess between at least two protrusions or an annular protrusion, where the recess can align with the mating striker pin 140. The mating striker pin 140 can include an annular ring that protrudes therefrom. The spring 142 can rest on the annular ring around the longitudinal pin portion of the mating striker pin 140. The mating striker pin 140 can be within the insulator 141 that forms a recess so that a bottom part of the mating striker pin 140 sticks therethrough. The recess in the insulator 141 can be dimensioned to receive the tool 138 (conducting body) and optionally, the body 139 therearound. Contacting the electrode 143 to the spring 142 so that the mating striker pin 140 conducts through the tool 138 to the striker pin 145 so that the rotating contact 146 electrically couples with the slip anchors 148 on the non-rotating body 147.

In some embodiments, a RF rotating electrode can include: a non-rotating body having a rounded lip forming a recess; slip anchors mounted to the body in the recess, the slip anchors being a conductive material; a rotating contact in electrical connection with the slip anchors, wherein the rotating contact includes a rounded edge so as to form a gap with the rounded lip of the non-rotating body; a striker pin electrically coupled to the slip anchors; an electrical insulator surrounding the striker pin; a mating striker pin seated in a spring; a conducting body connecting the striker pin and the mating striker pin; and an electrode electrically coupled with the spring.

In some embodiments, the present invention resolves several issues typical of similar processes described under U.S. Pat. No. 6,228,471 by replacing tungsten glowing filaments with refractory ceramic emitters 117 or carbon filaments. This resolves the durability issues confronted when used in hydrocarbon environments as tungsten filaments often break during deposition resulting in product loss. Carbon filaments are resilient to carbon contamination and cerium hexaboride increase plasma ionization levels by a tenfold when compared to tungsten filaments. The colder temperature associated with this glow reduces localized substrate heating and allows deposition of substrates previously unrealized at much lower pressures. The higher emission of the refractory ceramic elements 117 enhances this ionization rate of the plasma and increases the deposition rate which is a significant benefit in a price conscience market.

To better control the deposition process, the precursor 128 is evaporated with the evaporator 150 in step (a) in the chamber 100 is being dissociated to form a plasma 106 during or after introduction in step (b), by heating it from about 30° C. to about 1500° C. or by ionization from plasma 106 in step (c). During the process both the introduced precursor 128, process gasses 113, 123 and 151 and sputtered metals 121 in step (d) are partially ionized which promotes directionality 134 of the flux of species towards the substrate 103 enabling highly uniform deposition. In step (e) the voltage is preferably between 50 V and 1500 V and the frequency of the MF-voltage is best chosen between 30 kHz and 1000 kHz. A dark sheath of deposited material 105 (e.g., see 132 in FIG. 4) is formed. Therefore, the property of the arriving species is stoichiometric 133 and the growing film is perfectly columnar, uniform and pinhole free.

The precursor 128 is preferably an organosilicon compound in combination with a cycloalkane, such as but not limited to polydimethylsiloxane and dimethyladamantane.

An inert gas (e.g., gases 113, 123 or 151) or nitrogen (e.g., gases 113, 151) and oxygen (e.g., gas 113) is introduced in the vacuum chamber 100 and ionized for incorporation into the deposited tetrahedral amorphous hydrogenated carbon and amorphous siloxane hybrid diamond-like nanocomposite IDLN layer. During the deposition process at least one transition metal 121 is simultaneously deposited and partially ionized in plasma 106 to deposit in the composition layer, which can be achieved by PVD sputtering (e.g., with argon) preferably but not limited to high power impulse magnetrons 112.

In some embodiments, a number of deposition runs for the IDLN of tetrahedral amorphous hydrogenated carbon and amorphous siloxane hybrid diamond-like nanocomposite films on substrates (e.g., Si-wafers, aluminum foil, glassplates or steel plates) can be carried out in an improved vacuum reactor 100 made by Thin Film Service. (Livermore, CA, US).

In some embodiments, the flat substrates 103 (e.g., with a diameter up to 450 mm) were arranged on a rotatable support. Spherical and complex 3D shaped substrates can be covered as well. The base pressure in the vacuum chamber is preferred to be below $5\times10^{-7}$ mbar, better to be below $1\times10^{-7}$ mbar and allowed to be up to $5\times10^{-6}$ mbar. Initially the chamber is pumped down from atmosphere using a dry vacuum pump 124 and evacuation is done carefully via a soft-pump valve 120 so no particulates are disturbed. The typical working pressure is maintained at $1\times10^{-4}$ to $3\times10^{-3}$ mbar by turbomolecular pump 119 with speed control or controlled with throttle valves 118. The substrates can be cleaned by an in-situ (Ar— or Kr—) plasma etching process prior to deposition and lasting for 1 to 20 minutes. The substrate etching can be achieved with a remote plasma source (e.g., 108 or 109) or by substrate bias between 50 V and 2500 V by power source 101. The substrate temperature does generally not exceed 160° C. during etching and deposition but can be increased to 300° C. with the help of infrared substrate heating.

During the deposition process the temperature is generally bellow 160° C. with some outliers of 130° C. and 200° C. as the process varies. Film thicknesses vary generally from about 0.1 μm to about 8 μm but some recipes have grown layers up to 80 μm and are determined by stylus profilometry or calotest. Up to a film thickness less than 500 nm, the deposited film remains highly transparent in the visible range. The degree of transparency depends also on the bias voltage applied to the substrate during deposition. The deposition rate or film growth rate varies mostly between 0.5 and 2 μm/hr. The hydrophobic nature depends highly on the fluoride content in the film which is controlled through a mass flow controller 127.

A preferred liquid precursor 128 is a polydimethylsiloxane-dimethyladamantane engineered formula with a viscosity of ~25 cSt and a boiling point of <190° C. but other siloxanes and hydrocarbons could also be applied. In view of depositing a composition as defined in herein, the precursor 128 is preferably preheated above 100° C., such as by evaporator 150 before release in the chamber 100 with the aid of a carrier gas 151 and 123, which can be preferably but not limited to Argon. The precursor mix is delivered as vapor to the vacuum chamber 100 through an evaporator with temperature between 200° C. and 340° C. and further ionized by an RF-ICP source, such as RF plasma generator 109. The precursor is presented to the source as a vapor and is partially dissociated where further dissociation occurs in the chamber plasma 106 created by the refractory ceramic electron emitter 117.

A secondary plasma is established by a ceramic refractory emitter 117 or carbon filament and is placed between the ion source (e.g., RF plasma generator 109) and the substrate 103 (e.g., in top surface or bottom surface of chamber 100) and is biased typically between −10 V and −300 V (DC bias voltage) with a power source 116. A PID loop 111 controls the plasma density where the extraction voltage, ion energy, and current density are controlled. The emitter 117 is placed near the ion source and the substrate 103 and is about 25 cm to 30 cm from the substrate 103. The current in the emitter 117 is preferably from about 10 A to about 50 A. The plasma current can then typically amount to about 0.5 A to 60 A. The distance the metal flux from the target 121 travels through the high dense plasma is at least 16 cm, but preferably 35 cm, or higher which creates a level of ionization of 20 to 95%.

The distance between the ion source the substrate is at least about 15 cm and up to 50 cm. The residence time of the species travelling through the high dense plasma is important in achieving a highly ionized flux towards the substrate. The high level of ionization allows the process to work at pressures in the $E^{-4}$ mbar ($10^{-4}$) range and up to the $E^{-1}$ mbar ($10^{-1}$) range. The deposition action of the plasma ions by the substrate which is put to a negative mid frequency self-bias voltage of typically about 100V to about 300V, with a frequency from about 50 khz to about 320 khz, or a pulsed DC bias of up to 800 V (e.g., power source 101) negative with around 40-65% of ON cycle time.

The ionization in the remote plasma source of hydrocarbons and siloxanes along with the ionization in the plasma cloud 106 between source and substrate for both gasses 113, 123, 151 and evaporated precursor 128, and metal sputtered flux 121 compared to ionization in the dark space sheath (Few y/De) region near the substrate 103 can be optimized. The ability to pre-ionize and deposit at lower pressures allows for a wider range and better control of the substrate bias voltage. The energy deposition on the sub-plantation layer by ions can cause localized heating and hydrogen diffusion as energy applied can be much higher than the ideal energy, around 100 eV per carbon atom, at which the highest fraction of $SP^3$ is formed. This invention allows better control of the impacting ion energy.

Other similar processes rely on the dark space sheath 105 near the substrate to create ionization of species along with the energy needed for sub-plantation in the manufacture of DLC. The energy needed to create ionization at set pressure level, with a pressure generator 125, can determine the levels of energy needed to control the sub-plantation process. The present invention resolves the issue with depositing these diamond like nanocomposite materials through a biased mask 104, which typically ionize a fraction of the atoms near the front of the mask 104 while others will ionize near the substrate 103. The higher pressures needed in these processes to sustain a plasma will reduce the mean free path which results in an increased amount of elastic collisions for the species created in the mask region leading to energy loss on the way to the substrate 103. The distance these species need to travel is larger than the mean free path so multiple collisions occur, and valuable energy is lost. This also results in a reduced deposition rate which directly relates to the curved nature of the sheath associated with higher pressures. The directionality given by the electrical field will enhance the deposition on the mask 105 where it is preferred on the substrate. As shown in FIG. 3, this extra deposition 137 on the mask 131 will subsequently obstruct materials from reaching the substrate 103, which result in non-uniform coating 133. This creates a directionality not perpendicular 135 to the substrate which causes not only non-columnar growth but also nonstoichiometric film.

In the present invention, the much lower deposition pressure with higher ionization rates causes the sheath's edge to be parallel 132 (e.g., FIG. 4) to the mask's surface and the high-density plasma has already ionized the flux on the path towards the substrate 103. The result is an electrical field which is uniform, unidirectional and collisionless (e.g., devoid of collisions), which leads to a collimated 134 (e.g., FIG. 4) and controllable deposition. The present invention allows the bias process parameters to be chosen tailored for sub-plantation only as all species arriving near the substrate 103 are already properly ionized hence the substrate bias purpose is to create sub plantation only.

When introducing an inert gas such as Ar, Kr or $N_2$ to the vacuum chamber 100, films can be deposited with higher hardness besides the favorable low friction properties and addition of Fluoride will control hydrophobicity. Then this additional inert process gas is ionized as a result of the combination of the RF discharge in the ion source (RF plasma generator 109), the discharge using a refractory ceramic element 117 and an MF or DC bias voltage on the substrate 103. The substrate bias or self-bias voltage power source 101, preferably in the range of 100 to 800 V, attracts the Ar, Kr, $N_2$ or Fluoride ions to the substrate. This leads to a simultaneous inert gas ion bombardment of the growing tetrahedral amorphous hydrogenated carbon and amorphous siloxane hybrid diamond-like nanocomposite film in combination with the ionized metal species which were introduced through sputtering 122. A higher bias causes the deposition rate to decrease due to the co-sputtering effect, but the hardness of the deposition film increases. Additionally, increasing the process pressure 125 by increasing the inert gas load will also increases the hardness.

Using the process parameter limits and apparatus features described above, a number of tetrahedral amorphous hydrogenated carbon and amorphous siloxane hybrid diamond-like nanocomposite films, undoped or doped with metals were deposited with compositions within the ranges set above. Friction tests of samples at room temperature (25° C.) and of samples post heated to 1350° C. prepared using the process and equipment described above were carried out to determine the wear resistance and friction coefficient μ using standard pin-on-disk measurements. These tests were executed at room temperature in a Nanovea tribometer at a normal load of 2N (friction coefficient test). The pin is sliding unlubricated at a speed of 1.0 m/s during a great number of cycles over the surface of the film as deposited on the substrate. The coefficient of friction u is continuously measured during the test. The relative humidity was thereby monitored at a constant value of either 50% RH or 90% RH.

The PECVD-tetrahedral amorphous hydrogenated carbon and amorphous siloxane hybrid diamond-like nanocomposite films according to the invention are of course very suitable for any application or use where the presence of a very low coefficient of friction combined with a high hardness and wear resistance are required, in particular in very humid environments or in water. The application is thus useful as a low friction coating in prostheses for hip or knee joint replacement, for surgical knives, for razor blades and guide wires as well as automotive drivetrain parts and aeronautics components. They are also useful as protective coatings on hard disks for computers and on magnetic tapes.

In some embodiments, the present invention provides a largely ionized plasma having hydrocarbons, siloxanes and metals that are being deposited in a collimated way creating a highly uniform and stoichiometric composition creating a conductive or capacitive hard coat with excellent sliding properties preserved at extreme temperatures including but not limited to oxygen rich environments. The present invention provides a diamond like nanocomposite film that is created from tetrahedral amorphous hydrogenated carbon making it much harder and more temperature resistant. It is also a first where such DLN films are created using an improved version of an electron emitter realizing higher levels of reliability.

In some embodiments, the present invention uses at least one of a remote RF plasma source and/or an electron emitter that will create a dense plasma filling the entire chamber. This custom fabrication setup promotes the dissociation and ionization of molecules and atoms. In case of the RF plasma source trim gasses, preferable but not limited to Oxygen, Hydrogen, Argon, Nitrogen and Fluoride, can be introduced to the deposition and act as supplementary feed to the siloxanes and hydrocarbons used to form the nanocomposite layer.

In some embodiments, a method of forming a tetrahedral amorphous hydrogenated carbon and amorphous siloxane hybrid diamond-like nanocomposite can include: providing a source of H, C, O, and Si as a liquid precursor; providing evaporated precursor into a vacuum chamber; forming a plasma with an RF plasma generator and/or a thermal plasma generator; and depositing, on a rotating biased substrate, a collimated layer of the tetrahedral amorphous hydrogenated carbon and amorphous siloxane hybrid diamond-like nanocomposite having tetrahedral amorphous hydrogenated carbon (ta-C:H) and amorphous siloxane (a-Si:O), wherein the ta-C:H and a-Si:O are in an interpenetrating network. In some embodiments, the thermal plasma generator includes a carbon filament or a refractory ceramic emitter of hexaboride, a lanthanum hexaboride, cerium hexaboride. In some aspects, the method includes providing: gas dissociation levels from about 80% to about 100%; and ionization levels from about 20% to about 50%. In some comprising form a uniform surface on the collimated layer, wherein the uniform surface has a uniformity is within a 3% elevation change. In some aspects, the deposition rate is up to about 2 μm/h.

In some embodiments, the present invention provides an improved version of the filament-based dissociation technologies used in U.S. Pat. No. 6,228,471. This new electron emitter technology includes but is not limited to the use of carbon filaments or refractory ceramic emitters such as cerium hexaboride or lanthanum boride electrodes compared to the use of tungsten filaments. The combination of both sources realizes a dissociation rate of 20% to 100% and improves the ionization rate with levels of up to 50%. This is a direct result of the creation of a denser plasma with the use of a remote plasma source and the higher levels of emissions created by the refractory ceramic emitters.

In some embodiments, the present invention includes a doped tetrahedral amorphous hydrogenated carbon and amorphous siloxane hybrid diamond-like nanocomposite, which includes improved properties such as increased hardness, friction, temperature resistance, coefficient of friction and electrical tunability. The increase can be over a DLC or a DLN. The improved diamond like nanocomposite (IDLN) can include highly tetrahedral amorphous carbon instead of amorphous carbon. The IDLN can be formed from an organosiloxane, which can be provided polydymethylsiloxane. The IDLN can be formed from a hydrocarbon, such as dimethyladamantane or formed from a hydrocarbon gas. The IDLN can have a temperature resistance of at least about 1450° C. The IDLN can include an electrical resistivity from about $10^{-3}$ Ohm·cm to about $10^{11}$ Ohm·cm. The IDLN can include a transmittance in VIS at over 85% for films up to 100 nm thick. In some aspects, the composition of the IDLN comprises preferably 30 to 70 at % of C, 5 to 40 at % of H, 10 to 25 at % of Si and 7 to 15 at % of O. The IDLN can include a coefficient of friction (COF) of <0.1 but typically of <0.02 in air with high relative humidity, and can have this COF in vacuum, after exposure of 1000° C. in oxygen and/or exposure to 1350° C. in a vacuum. The IDLN can include a $sp^3$ content in the film of up to 80%. The density of the IDLN film is greater than or equal to about 2.2 gm/cm$^3$. The hydrophobic properties of the IDLN have shown contact angles of up to 155 degrees. The internal stress of the IDLN can be from about 50 Mpa to about 200 Mpa. The IDLN can have a nanohardness is from about 6 Gpa to about 40 GPA.

In some embodiments, the IDLN can include superhydrophobic and low friction surface, such as from $CF_4$. The $CF_4$ concentration in top layer (e.g., top coating that provides the exposed surface) ranges from about 40 wt % to 125 wt % of the Argon concentration.

In some embodiments, the present invention provides a method of making the IDLN material (e.g., coating on substrate) described herein. The method provides collimated deposition along the entire substrate of hydrocarbons, siloxanes and metals with a higher deposition rate and higher uniformity than previously realized before. During the deposition, the gas dissociation levels are 80% to 100% with ionization levels between 20% and 50%. The uniformity of the IDLN is within 3% on 300 mm substrates. The deposition rate can be up to about 2 μ/h In some embodiments, the electron emitter technology now includes, but is not limited to, the use of carbon filaments or refractory ceramic emitters such as cerium hexaboride or lanthanum boride electrodes. These electrodes are an improvement over the use of tungsten filaments. In some aspects, the gasses and metals can by ionized. Also, the film can be applied to all types of electrostatic chucks whether or not these rely on Johnsen-Rahbek or Coulomb principles.

EXAMPLES

Example 1

Dry running bearing lubrication for harsh environments and high temperatures can be achieved with the IDLN material. By means of the coating method according to the invention, a low friction, wear resistant coating has been successfully applied onto the rotor of a rotary engine.

Example 2

Corrosion protection on heater parts can be achieved with the IDLN material. Corrosion protection on Silicon carbide heater parts where Molybdenum and Tungsten pins were successfully coated with a protective layer, exposing the heater parts at 800° C. in oxygen.

Example 3

Wear protection on PVD ESC MCA electrostatic chucks can be achieved with the IDLN material. To reduce particulate formation and extend the lifetime of Physical Vapor Deposition (PVD), Minimum contact Area (MCA), Electrostatic chucks (ESC), a low particulate film with excellent wear properties but with a lower hardness of 7.5 GPA was successfully applied to 200 mm and 300 mm pedestals. This is an important improvement over competing films used to protect electrostatic chucks where TiN films typically applied on 200 mm substrates have an elevated backside particulate count caused by pull-out which is a result from non-stoichiometric film deposition and where DLC has a similar issue mainly on the circumference of the larger 300 mm substrates where shadowing related to the sinusoidal distribution of the sputtered metal flux results in seed and/or nodule formation which in turn results in non-stoichiometric film growth and pinholes which are released as migrating particles. These secondary particles are detrimental in environments where high purity and clean environments are crucial.

Example 4

Wear protection on ION Implant chucks can be achieved with the IDLN material. A highly dielectric film with resistivity in the 1011 Ohm·cm range was applied onto ION Implant chucks.

Example 5

Wear protection on CVD pedestal can be achieved with the IDLN material. The IDLN material has been used to coat the mesas with our high temperature coating.

Example 6

Piston ring coatings can be achieved with the IDLN material. Our high temperature coating has been successfully applied to competitive racing piston rings where all sides, inside and out, including the gap sides were coated with our low friction high temperature coating.

Because of their chemical inertness, low wear and intrinsic smoothness, these films give access to appealing industrial applications such as hard, self-lubricating films where temperature resistance and cleanliness are important, e.g., for protection of aeronautic applications and space applications, harsh media pumps and consumer products. In addition, because of its ionic barrier properties, low internal stress and bio compatibility, it is a perfect candidate for intravascular devices and other implants.

Also drivetrain components operating in sustained continuous high temperature exposure including but not limited to cylinder heads and turbochargers. The high temperature resistance in high oxygen environments combined with the dry lubricating properties of this coating will appeal to the aeronautics and space industry where durable wear resistant coatings are desired and where lubrication cannot be applied. Applications targeted include but are not limited to turbine blades and bearings. Besides serving as a protective film for semiconductor pedestals where the electrostatic chucking processes relies on Johnsen-Rahbek or Coulomb, these films can also be applied in process chambers and vacuum load-locks for covering substrates with a layer or film of such a composition where it withstands high temperature PVD, CVD and etch processes.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

In one embodiment, the present methods can include aspects performed on a computing system. As such, the computing system can include a memory device that has the computer-executable instructions for performing the method. The computer-executable instructions can be part of a computer program product that includes one or more algorithms for performing any of the methods of any of the claims.

In one embodiment, any of the operations, processes, methods, or steps described herein can be implemented as computer-readable instructions stored on a computer-readable medium. The computer-readable instructions can be executed by a processor of a wide range of computing systems from desktop computing systems, portable computing systems, tablet computing systems, hand-held computing systems as well as network elements, base stations, femtocells, and/or any other computing device.

There is little distinction left between hardware and software implementations of aspects of systems; the use of hardware or software is generally (but not always, in that in certain contexts the choice between hardware and software can become significant) a design choice representing cost vs. efficiency tradeoffs. There are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a CD, a DVD, a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those generally found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

Figure 7:
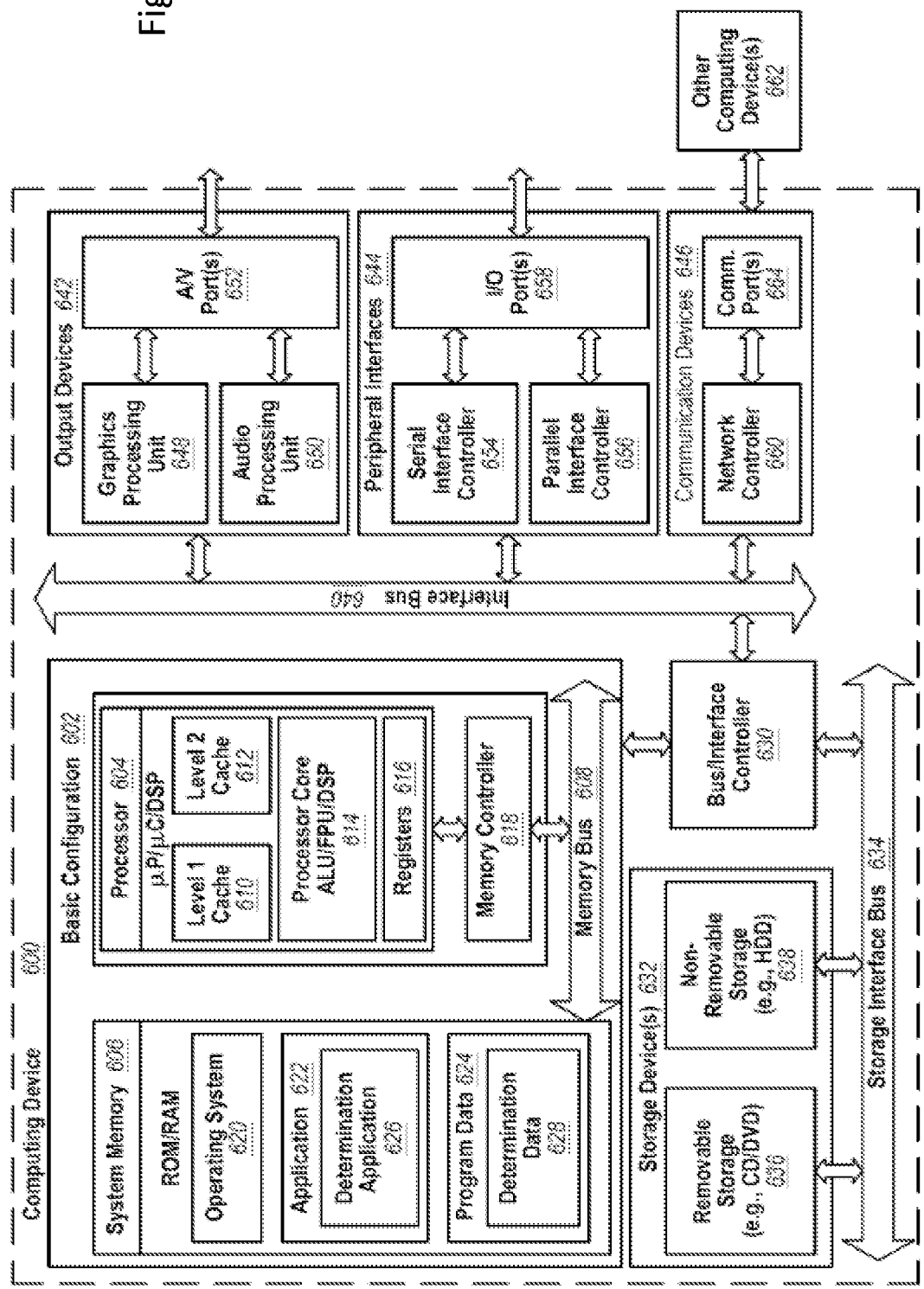
FIG. 7 illustrates an embodiment of a computing system that can be used to control the equipment and operational parameters thereof for forming the tetrahedral amorphous hydrogenated carbon and amorphous siloxane hybrid diamond-like nanocomposite.

FIG. 7 shows an example computing device 600 that is arranged to perform any of the computing methods described herein. In a very basic configuration 602, computing device 600 generally includes one or more processors 604 and a system memory 606. A memory bus 608 may be used for communicating between processor 604 and system memory 606.

Depending on the desired configuration, processor 604 may be of any type including but not limited to a microprocessor (µP), a microcontroller (µC), a digital signal processor (DSP), or any combination thereof. Processor 604 may include one more levels of caching, such as a level one cache 610 and a level two cache 612, a processor core 614, and registers 616. An example processor core 614 may include an arithmetic logic unit (ALU), a floating point unit (FPU), a digital signal processing core (DSP Core), or any combination thereof. An example memory controller 618 may also be used with processor 604, or in some implementations memory controller 618 may be an internal part of processor 604.

Depending on the desired configuration, system memory 606 may be of any type including but not limited to volatile memory (such as RAM), non-volatile memory (such as ROM, flash memory, etc.) or any combination thereof. System memory 606 may include an operating system 620, one or more applications 622, and program data 624. Application 622 may include a determination application 626 that is arranged to perform the functions as described herein including those described with respect to methods described herein. Program Data 624 may include determination information 628 that may be useful for analyzing the contamination characteristics provided by the sensor unit 240. In some embodiments, application 622 may be arranged to operate with program data 624 on operating system 620 such that the work performed by untrusted computing nodes can be verified as described herein. This described basic configuration 602 is illustrated in FIG. 6 by those components within the inner dashed line.

Computing device 600 may have additional features or functionality, and additional interfaces to facilitate communications between basic configuration 602 and any required devices and interfaces. For example, a bus/interface controller 630 may be used to facilitate communications between basic configuration 602 and one or more data storage devices 632 via a storage interface bus 634. Data storage devices 632 may be removable storage devices 636, non-removable storage devices 638, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 606, removable storage devices 636 and non-removable storage devices 638 are examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 600. Any such computer storage media may be part of computing device 600.

Computing device 600 may also include an interface bus 640 for facilitating communication from various interface devices (e.g., output devices 642, peripheral interfaces 644, and communication devices 646) to basic configuration 602 via bus/interface controller 630. Example output devices 642 include a graphics processing unit 648 and an audio processing unit 650, which may be configured to communicate to various external devices such as a display or speakers via one or more A/V ports 652. Example peripheral interfaces 644 include a serial interface controller 654 or a parallel interface controller 656, which may be configured to communicate with external devices such as input devices (e.g., keyboard, mouse, pen, voice input device, touch input device, etc.) or other peripheral devices (e.g., printer, scanner, etc.) via one or more I/O ports 658. An example communication device 646 includes a network controller 660, which may be arranged to facilitate communications with one or more other computing devices 662 over a network communication link via one or more communication ports 664.

The network communication link may be one example of a communication media. Communication media may generally be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 600 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 600 may also be implemented as a personal computer including both laptop computer and non-laptop computer configurations. The computing device 600 can also be any type of network computing device. The computing device 600 can also be an automated system as described herein.

The embodiments described herein may include the use of a special purpose or general-purpose computer including various computer hardware or software modules.

Embodiments within the scope of the present invention also include computer-readable media for carrying or having computer-executable instructions or data structures stored thereon. Such computer-readable media can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium which can be used to carry or store desired program code means in the form of computer-executable instructions or data structures and which can be accessed by a general purpose or special purpose computer. When information is transferred or provided over a network or another communications connection (either hardwired, wireless, or a combination of hardwired or wireless) to a computer, the computer properly views the connection as a computer-readable medium. Thus, any such connection is properly termed a computer-readable medium. Combinations of the above should also be included within the scope of computer-readable media.

Computer-executable instructions comprise, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used herein, the term "module" or "component" can refer to software objects or routines that execute on the computing system. The different components, modules, engines, and services described herein may be implemented as objects or processes that execute on the computing system (e.g., as separate threads). While the system and methods described herein are preferably implemented in software, implementations in hardware or a combination of software and hardware are also possible and contemplated. In this description, a "computing entity" may be any computing system as previously defined herein, or any module or combination of modulates running on a computing system.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

All references recited herein are incorporated herein by specific reference in their entirety.

References: U.S. Pat. Nos. 5,352,493; 5,466,431; 5,638,251; 5,718,976; 5,728,465; 6,200,675; 6,228,471; 6,472,062; 6,713,178; 6,697,157; and 10,053,778.

The invention claimed is:

1. A method of forming a tetrahedral amorphous hydrogenated carbon and amorphous siloxane hybrid diamond-like nanocomposite, the method comprising:
    providing a source of H, C, O, and Si as a liquid precursor;
    providing evaporated precursor into a vacuum chamber;
    forming a plasma with an RF plasma generator and/or a thermal plasma generator; and
    depositing, on a rotating biased substrate, a collimated layer of the tetrahedral amorphous hydrogenated carbon and amorphous siloxane hybrid diamond-like nanocomposite having tetrahedral amorphous hydrogenated carbon (ta-C:H) and amorphous siloxane (a-Si:O), wherein the ta-C:H and a-Si:O are in an interpenetrating network.

2. The method of claim 1, wherein the thermal plasma generator includes a carbon filament or a refractory ceramic emitter of hexaboride, a lanthanum hexaboride, cerium hexaboride.

3. The method of claim 1, further comprising providing:
    gas dissociation levels from about 80% to about 100%; and
    ionization levels from about 20% to about 50%.

4. The method of claim 1, further comprising forming a uniform surface on the collimated layer, wherein the uniform surface has a uniformity is within a 3% elevation change.

5. The method of claim 1, wherein a deposition rate is up to about 2 μm/h.

6. The method of claim 1, comprising:
    forming a first layer of a first tetrahedral amorphous hydrogenated carbon and amorphous siloxane hybrid diamond-like nanocomposite, the first layer being the collimated layer;
    forming a transition layer having a transition of tetrahedral amorphous hydrogenated carbon and amorphous siloxane hybrid diamond-like nanocomposite; and
    forming a second layer of a second tetrahedral amorphous hydrogenated carbon and amorphous siloxane hybrid diamond-like nanocomposite, wherein the first layer is different from the second layer, wherein the transition layer is between the first layer and second layer.

7. The method of claim 6, wherein the first layer, second layer, and transition layer comprise:
    the tetrahedral amorphous hydrogenated carbon (ta-C:H); and
    the amorphous siloxane (a-Si:O),
    wherein the ta-C:H and a-Si:O are in an interpenetrating network.

8. The method of claim 6, further comprising forming a top layer of fluorocarbon above the second layer.

9. The method of claim 8, wherein the top layer includes Argon, and the fluorocarbon is present in the top layer from about 50 wt % to about 110 wt % of the Argon in the top layer.

10. The method of claim 6, wherein the transition layer includes a gradient from the first layer to the second layer.

11. The method of claim 1, wherein the siloxane is polydimethylsiloxane.

12. The method of claim 1, further comprising doping with at least one transition metal.

13. The method of claim 12, wherein the transition metal is at least one of:
    a IB group transition metal selected from the group of Cu, Ag, Au, or Rg;
    a IIB group transition metal selected from the group of Zn, Cd, Hg, or Cn;
    a IIIB group transition metal selected from Sc and Y;
    a IVB group transition metal selected from Ti, Zr, Hf, and Rf;
    a VB group transition metal selected from V, Nb, Ta, and Db;
    a VIB group transition metal selected from Cr, Mo, W, and Sg;
    a VIIB group transition metal selected from Mn, Tc, Re, and Bh; or
    a VIIIB group transition metal selected from Fe, Ru, Os, and Hs.

14. The method of claim 13, wherein the transition metal is included in a doping amount to achieve a resistivity about $10^{-3}$ Ohm·cm to about $10^{11}$ Ohm·cm.

15. The method of claim 1, wherein the liquid precursor comprises:
    hydrogen from about 0.5 at % to about 45 at %;
    carbon from about 50 at % to about 92 at %;
    silicon from about 10 at % to about 25 at %; and
    oxygen from about 7 at % to about 15 at %.

16. The method of claim 1, further comprising evaporating the liquid precursor to a gaseous state by an evaporator.

17. The method of claim 1, wherein providing the evaporated precursor into the vacuum chamber comprises controlling flow of the evaporated precursor through mass flow controllers.

18. The method of claim 1, wherein depositing the collimated layer is done by a bipolar asymmetrical pulsed DC-biased or mid frequency self-bias voltage of 30 V to 1100 V.

19. The method of claim 1, wherein the vacuum chamber comprises a base pressure below $5 \times 10^{-7}$ mbar.

20. The method of claim 1, further comprising, prior to depositing the collimated layer: depositing a titanium nitride layer that is from about 0.05 microns to about 2 microns.

* * * * *